United States Patent
Temme et al.

(10) Patent No.: US 10,810,507 B2
(45) Date of Patent: *Oct. 20, 2020

(54) MULTI-MODE QUBIT READOUT AND QUBIT STATE ASSIGNMENT

(71) Applicant: International Business Machines Corporation, Armonk, NY (US)

(72) Inventors: Paul Kristan Temme, Ossining, NY (US); Salvatore Bernardo Olivadese, Stamford, CT (US); Antonio Corcoles-Gonzalez, Mount Kisco, CT (US); Jay M. Gambetta, Yorktown Heights, NY (US); Lev Samuel Bishop, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/810,302

(22) Filed: Mar. 5, 2020

(65) Prior Publication Data
US 2020/0210879 A1    Jul. 2, 2020

Related U.S. Application Data

(63) Continuation of application No. 16/219,346, filed on Dec. 13, 2018, now Pat. No. 10,650,322.

(51) Int. Cl.
*G06N 99/00*    (2019.01)
*G06N 10/00*    (2019.01)
(Continued)

(52) U.S. Cl.
CPC .............. *G06N 10/00* (2019.01); *B82Y 10/00* (2013.01); *G06F 9/3877* (2013.01);
(Continued)

(58) Field of Classification Search
CPC ... B82Y 10/00; G06F 9/3877; G06F 13/4068; G06N 10/00; G06N 99/00; H03H 3/007
See application file for complete search history.

(56) References Cited

U.S. PATENT DOCUMENTS

| | | |
|---|---|---|
| 7,230,266 B2 | 6/2007 | Hilton et al. |
| 8,508,280 B2 | 8/2013 | Naaman et al. |
| (Continued) | | |

OTHER PUBLICATIONS

Non-Final Office Action received for U.S. Appl. No. 16/219,346 dated Sep. 10, 2019, 33 pages.
(Continued)

*Primary Examiner* — Alexander H Taningco
*Assistant Examiner* — Kurtis R Bahr
(74) *Attorney, Agent, or Firm* — Amin, Turocy & Watson, LLP

(57) ABSTRACT

Systems, computer-implemented methods, and computer program products to facilitate external port measurement of qubit port responses are provided. According to an embodiment, a system can comprise a memory that stores computer executable components and a processor that executes the computer executable components stored in the memory. The computer executable components can comprise an analysis component that can analyze responses of a multi-mode readout device coupled to a qubit. The computer executable components can further comprise an assignment component that can assign a readout state of the qubit based on the responses. In some embodiments, the multi-mode readout device can be electrically coupled to at least one of the qubit or an environment of the qubit based on a defined electrical coupling value.

20 Claims, 10 Drawing Sheets

(51) Int. Cl.
*H03H 3/007* (2006.01)
*B82Y 10/00* (2011.01)
*G06F 13/40* (2006.01)
*G06F 9/38* (2018.01)

(52) U.S. Cl.
CPC ......... *G06F 13/4068* (2013.01); *G06N 99/00* (2013.01); *H03H 3/007* (2013.01)

(56) References Cited

U.S. PATENT DOCUMENTS

| | | | |
|---|---|---|---|
| 9,218,571 B2 | 12/2015 | Abraham et al. | |
| 9,438,246 B1* | 9/2016 | Naaman | H03K 19/195 |
| 9,501,748 B2 | 11/2016 | Naaman et al. | |
| 9,692,423 B2 | 6/2017 | McDermott, III et al. | |
| 9,818,796 B2 | 11/2017 | Abraham et al. | |
| 9,892,365 B2 | 2/2018 | Rigetti et al. | |
| 9,893,262 B2 | 2/2018 | Thompson et al. | |
| 2007/0252081 A1* | 11/2007 | Munro | B82Y 10/00 250/282 |
| 2015/0324705 A1* | 11/2015 | Biercuk | G06F 3/0673 711/101 |
| 2016/0071021 A1* | 3/2016 | Raymond | G06F 15/76 712/28 |
| 2016/0191060 A1* | 6/2016 | McDermott, III | H03K 19/195 326/3 |
| 2016/0292586 A1* | 10/2016 | Rigetti | G06F 15/80 |
| 2017/0091648 A1* | 3/2017 | Abdo | H03H 7/004 |
| 2018/0013052 A1 | 1/2018 | Oliver et al. | |
| 2018/0218281 A1* | 8/2018 | Reinhardt | G06N 10/00 |
| 2018/0260730 A1* | 9/2018 | Reagor | G06F 15/82 |
| 2018/0330264 A1* | 11/2018 | Lanting | G06N 10/00 |
| 2019/0131683 A1* | 5/2019 | Abdo | H01P 11/007 |

OTHER PUBLICATIONS

Blais, et al., Cavity quantum electrodynamics for superconducting electrical circuits: An architecture for quantum Computation, Feb. 7, 2004, 14 pages.
Jeffrey, et al., Fast Accurate State Measurement with Superconducting Qubits, Physical Review Letters, May 16, 2014, pp. 190504-1-190504-5, vol. 112.
Bronn, et al., Broadband Filters for Abatement of Spontaneous Emission in Circuit Quantum Electrodynamics, Oct. 29, 2015, 5 Pages.
Gambetia, et al., A superconducting qubit with Purcell protection and tunable coupling, May 28, 2018, 4 Pages.
Notice of Allowance received for U.S. Appl. No. 16/219,346 dated Dec. 27, 2019, 23 pages.
Appendix P—List of related IBM applications.
International Search Report and Written Opinion received for PCT Application Serial No. PCT/EP2019/083224 dated Mar. 12, 2020, 15 pages.
Ryan et al., "Hardware for Dynamic Quantum Computing" Cornell University Library, DOI: 10.1063/1.5006525, Apr. 26, 2017, 14 pages.
Xie et al., "Scalable 3D quantum memory", ARXIV.org, Cornell University Library, Mar. 13, 2018, 149 pages.
Solgun, Firat, "Analysis and Synthesis of Multi-Quibit, Multi-Mode Quantum Devices—Chapters 1-2", URL:hllps://d-nb.info/1128231700/34 Section 22, Mar. 27, 2015, 35 pages.
Sank et al., "Fast Scalable State Measurement with Superconducting Qubits", Arxiv.org, XP080000041, Jan. 17, 2014, pp. 1-4.

* cited by examiner

MULTI-MODE QUBIT READOUT AND QUBIT STATE ASSIGNMENT

BACKGROUND

The subject disclosure relates to superconducting quantum circuits, and more specifically, to multi-mode qubit readout and qubit state assignment.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits (qubits), and use interference.

Quantum computing hardware is different from classical computing hardware. In particular, superconducting quantum circuits generally rely on Josephson junctions, which can be fabricated on a semiconductor substrate. A Josephson junction generally manifests the Josephson effect of a supercurrent, where current can flow indefinitely across a Josephson junction without an applied voltage. One or more Josephson junctions can be embedded in a superconducting circuit to form a quantum bit (qubit). A plurality of such qubits can be arranged in a superconducting quantum circuit fabricated on a semiconductor substrate, which can further comprise microwave readout resonators coupled to the respective qubits that facilitate reading quantum information of the qubits (also referred to as addressing or reading a quantum logic state of the qubit). Such a superconducting quantum circuit and microwave readout resonators can be integrated onto a semiconducting substrate to form an integrated quantum processor that can execute computations and information processing functions that are substantially more complex than can be executed by classical computing devices (e.g., general-purpose computers, special-purpose computers, etc.).

A problem associated with efficiently and rapidly reading out a superconducting qubit involves a number of design parameters often in conflict with each other. First, typically what is known as Quantum-non-demolition (QND) measurements are preferred so that the qubits can be used again in a particular computation or algorithm after the measurement. This restricts almost exclusively the readout technique to the different regimes present in the circuit Quantum Eletrodynamics (circuit-QED) architecture, in which a superconducting resonator is coupled, capacitively or inductively, to a superconducting qubit. The quantum state of the qubit affects the resonance frequency of the coupled resonator and a precise readout of the qubit can be attained this way.

Whereas fast readout is often preferred, a readout resonator strongly coupled to the environment results in lower qubit coherence via the Purcell effect, by which the qubit relaxes its energy via the resonator to the environment. To alleviate this mechanism, some existing superconducting quantum systems employ a variety of filters that allow photons at the resonator frequency to be transmitted through the readout lines while curbing the relaxation of the qubit. These filters can be bulky and are often accompanied by design fabrication constrains that can limit the control of the dynamics of each readout resonator.

In addition, the large coupling of the readout resonator to the environment that makes possible fast, high-fidelity qubit state assignment, makes the system extremely sensitive to noise at the resonator frequency, which dephases the qubit in detriment of its coherence time. Purcell filters only protect the qubit against decay but do not protect the resonator against dephasing noise.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, and/or computer program products that can facilitate multi-mode qubit readout and state assignment are described.

According to an embodiment, a system can comprise a memory that stores computer executable components and a processor that executes the computer executable components stored in the memory. The computer executable components can comprise an analysis component that can analyze responses of a multi-mode readout device coupled to a qubit. The computer executable components can further comprise an assignment component that can assign a readout state of the qubit based on the responses. An advantage of such a system is that it can provide improved qubit readout fidelity without incurring increased qubit decay (e.g., due to the Purcell effect) and/or increased dephasing, without employing a Purcell filter.

In some embodiments, the multi-mode readout device can be electrically coupled to at least one of the qubit or an environment of the qubit based on a defined electrical coupling value. An advantage of such a system is that it can weakly couple the multi-mode readout device to a qubit and/or an environment of a qubit, where such weak coupling can facilitate improved accuracy of simulation results generated by the system, which can facilitate improved processing accuracy, improved processing efficiency, and/or improved processing performance of a processing unit associated with the system.

According to an embodiment, a computer-implemented method can comprise analyzing, by a system operatively coupled to a processor, responses of a multi-mode readout device coupled to a qubit. The computer-implemented method can further comprise assigning, by the system, a readout state of the qubit based on the responses. An advantage of such a computer-implemented method is that it can be employed to provide improved qubit readout fidelity without incurring increased qubit decay (e.g., due to the Purcell effect) and/or increased dephasing, without employing a Purcell filter.

In some embodiments, the analyzing can comprise, analyzing, by the system, the responses of the multi-mode readout device electrically coupled to at least one of the qubit or an environment of the qubit based on a defined electrical coupling value. An advantage of such a computer-implemented method is that it can be employed to weakly couple a multi-mode readout device to a qubit and/or an environment of a qubit, where such weak coupling can facilitate improved accuracy of simulation results generated by a system coupled to the multi-mode readout device, which can facilitate improved processing accuracy, improved processing efficiency, and/or improved processing performance of a processing unit associated with the system.

According to another embodiment, a computer program product that can facilitate a multi-mode qubit readout and state assignment process. The computer program product can comprise a computer readable storage medium having program instructions embodied therewith, the program instructions can be executable by a processor to cause the processor to analyze, by the processor, responses of a multi-mode readout device coupled to a qubit. The program instructions can be further executable to cause the processor to assign, by the processor, a readout state of the qubit based on the responses. An advantage of such a computer program product is that it can be employed to provide improved qubit readout fidelity without incurring increased qubit decay (e.g., due to the Purcell effect) and/or increased dephasing, without employing a Purcell filter.

In some embodiments, the program instructions can also be executable to cause the processor to analyze, by the processor, the responses of the multi-mode readout device electrically coupled to at least one of the qubit or an environment of the qubit based on a defined electrical coupling value. An advantage of such a computer program product is that it can be employed to weakly couple a multi-mode readout device to a qubit and/or an environment of a qubit, where such weak coupling can facilitate improved accuracy of simulation results generated by a system coupled to the multi-mode readout device, which can facilitate improved processing accuracy, improved processing efficiency, and/or improved processing performance of a processing unit associated with the system.

According to another embodiment, a system can comprise a memory that stores computer executable components and a processor that executes the computer executable components stored in the memory. The computer executable components can comprise an analysis component that can analyze responses of readout devices coupled to a qubit. The computer executable components can further comprise an assignment component that can assign a readout state of the qubit based on the responses. An advantage of such a system is that it can provide improved qubit readout fidelity without incurring increased qubit decay (e.g., due to the Purcell effect) and/or increased dephasing, without employing a Purcell filter.

In some embodiments, the readout devices can be electrically coupled to at least one of the qubit or an environment of the qubit based on a defined electrical coupling value. An advantage of such a system is that it can weakly couple the readout devices to a qubit and/or an environment of a qubit, where such weak coupling can facilitate improved accuracy of simulation results generated by the system, which can facilitate improved processing accuracy, improved processing efficiency, and/or improved processing performance of a processing unit associated with the system.

According to another embodiment, a computer-implemented method can comprise analyzing, by a system operatively coupled to a processor, responses of readout devices coupled to a qubit. The computer-implemented method can further comprise assigning, by the system, a readout state of the qubit based on the responses. An advantage of such a computer-implemented method is that it can be employed to provide improved qubit readout fidelity without incurring increased qubit decay (e.g., due to the Purcell effect) and/or increased dephasing, without employing a Purcell filter.

In some embodiments, the analyzing can comprise analyzing, by the system, the responses of the readout devices electrically coupled to at least one of the qubit or an environment of the qubit based on a defined electrical coupling value. An advantage of such a computer-implemented method is that it can be employed to weakly couple the readout devices to a qubit and/or an environment of a qubit, where such weak coupling can facilitate improved accuracy of simulation results generated by a system coupled to the readout devices, which can facilitate improved processing accuracy, improved processing efficiency, and/or improved processing performance of a processing unit associated with the system.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Given the above problem with qubit decay and/or dephasing of qubits caused by probing and/or measuring qubit state of such qubits, the present disclosure can be implemented to produce a solution to this problem in the form of systems, computer-implemented methods, and/or computer program products that can facilitate analyzing responses of a multi-mode readout device coupled to a qubit and/or different individual modes of multiple single-mode readout devices coupled to a qubit and/or assigning a readout state of the qubit based on the responses. An advantage of such systems, computer-implemented methods, and/or computer program products is that they can be employed to provide improved qubit readout fidelity without incurring increased qubit decay (e.g., due to the Purcell effect) and/or increased dephasing, without employing a Purcell filter.

Furthermore, given the above problem with qubit decay and/or dephasing of qubits caused by probing and/or measuring qubit state of such qubits, the present disclosure can be implemented to produce a solution to this problem in the form of systems, computer-implemented methods, and/or computer program products that, in some embodiments, can facilitate electrically coupling the multi-mode readout device and/or multiple single-mode readout devices to at least one of the qubit or an environment of the qubit based on a defined electrical coupling value. An advantage of such systems, computer-implemented methods, and/or computer program products is that they can be employed to weakly couple the multi-mode readout device and/or the multiple single-mode readout devices to a qubit and/or an environment of a qubit, where such weak coupling can facilitate improved accuracy of simulation results generated by a system coupled to such devices, which can facilitate improved processing accuracy, improved processing efficiency, and/or improved processing performance of a processing unit associated with the system.

Figure 1:
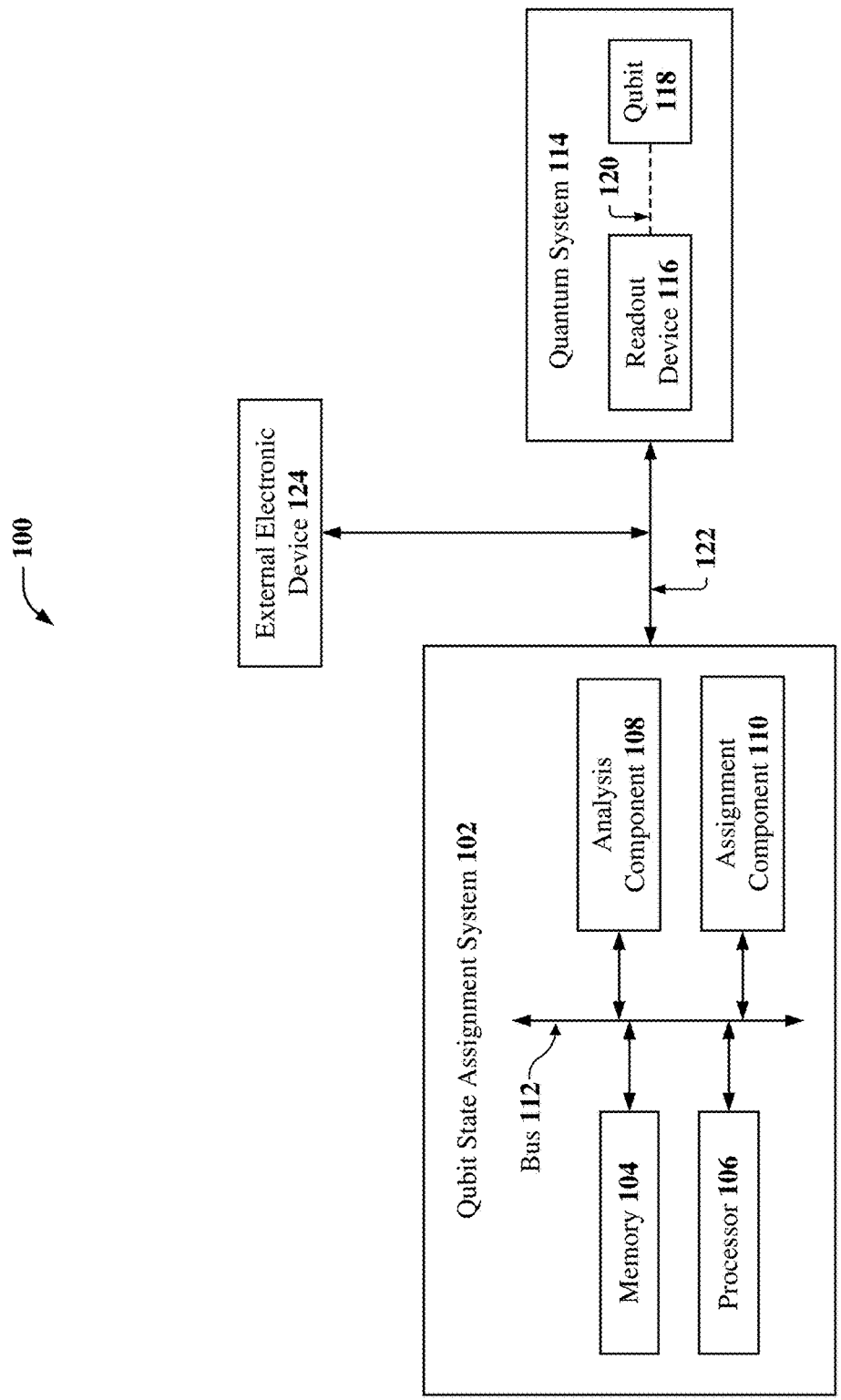
FIG. 1 illustrates a block diagram of an example, non-limiting system that can facilitate multi-mode qubit readout and state assignment components in accordance with one or more embodiments described herein.

FIG. 1 illustrates a block diagram of an example, non-limiting system 100 that can facilitate multi-mode qubit readout and state assignment components in accordance with one or more embodiments described herein. According to several embodiments, system 100 can comprise a qubit state assignment system 102, a quantum system 114, and/or an external electronic device 124. In some embodiments, qubit state assignment system 102 can comprise a memory 104, a processor 106, an analysis component 108, an assignment component 110, and/or a bus 112. In some embodiments, quantum system 114 can comprise one or more readout devices 116 and/or one or more qubits 118. In some embodiments, components of quantum system 114 can be coupled (e.g., electrically, communicatively, operatively, etc.) to one another via electrical circuitry 120. In some embodiments, components of system 100 such as, for example, qubit state assignment system 102, quantum system 114, and/or external electronic device 124, can be coupled (e.g., electrically, communicatively, operatively, etc.) via a linear passive microwave structure 122.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, qubit state assignment system 102, quantum system 114, and/or external electronic device 124 can further comprise various computer and/or computing-based elements described herein with reference to operating environment 1000 and FIG. 10. In several embodiments, such computer and/or computing-based elements can be used in connection with implementing one or more of the systems, devices, components, and/or computer-implemented operations shown and described in connection with FIG. 1 or other figures disclosed herein.

According to multiple embodiments, memory 104 can store one or more computer and/or machine readable, writable, and/or executable components and/or instructions that, when executed by processor 106, can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to qubit state assignment system 102, analysis component 108, assignment component 110, quantum system 114, readout device 116, qubit 118, external electronic device 124, and/or another component associated with system 100 and/or qubit state assignment system 102, as described herein with or without reference to the various figures of the subject disclosure.

In some embodiments, memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 1016 and FIG. 10. Such examples of memory 104 can be employed to implement any embodiments of the subject disclosure.

According to multiple embodiments, processor 106 can comprise one or more types of processors and/or electronic circuitry that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, and/or another type of processor. Further examples of processor 106 are described below with reference to processing unit 1014 and FIG. 10. Such examples of processor 106 can be employed to implement any embodiments of the subject disclosure.

In some embodiments, qubit state assignment system 102, memory 104, processor 106, analysis component 108, assignment component 110, and/or another component of qubit state assignment system 102 as described herein can be communicatively, electrically, and/or operatively coupled to one another via a bus 112 to perform functions of system 100, qubit state assignment system 102, and/or any components coupled therewith. In several embodiments, bus 112 can comprise one or more memory bus, memory controller, peripheral bus, external bus, local bus, and/or another type of bus that can employ various bus architectures. Further examples of bus 112 are described below with reference to system bus 1018 and FIG. 10. Such examples of bus 112 can be employed to implement any embodiments of the subject disclosure.

In some embodiments, qubit state assignment system 102, quantum system 114, and/or external electronic device 124 can comprise any type of component, machine, device, facility, apparatus, and/or instrument that comprises a processor and/or can be capable of effective and/or operative communication with a wired and/or wireless network. All such embodiments are envisioned. For example, qubit state assignment system 102, quantum system 114, and/or external electronic device 124 can comprise a server device, a computing device, a general-purpose computer, a special-purpose computer, a quantum computing device (e.g., a quantum computer, a quantum processor, etc.), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

In some embodiments, qubit state assignment system 102, quantum system 114, and/or external electronic device 124 can be coupled (e.g., communicatively, electrically, operatively, etc.) to one or more external systems, sources, and/or devices (e.g., computing devices, communication devices, etc.) via a data cable (e.g., coaxial cable, High-Definition Multimedia Interface (HDMI), recommended standard (RS) 232, Ethernet cable, etc.). In some embodiments, qubit state assignment system 102, quantum system 114, and/or external electronic device 124 can be coupled (e.g., communicatively, electrically, operatively, etc.) to one or more external systems, sources, and/or devices (e.g., computing devices, communication devices, etc.) via a network.

According to multiple embodiments, such a network can comprise wired and wireless networks, including, but not limited to, a cellular network, a wide area network (WAN) (e.g., the Internet) or a local area network (LAN). For example, qubit state assignment system 102, quantum system 114, and/or external electronic device 124 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, qubit state assignment system 102, quantum system 114, and/or external electronic device 124 can thus include hardware (e.g., a central processing unit (CPU), a transceiver, a decoder), software (e.g., a set of threads, a set of processes, software in execution) or a combination of hardware and software that facilitates communicating information between qubit state assignment system 102, quantum system 114, and/or external electronic device 124 and external systems, sources, and/or devices (e.g., computing devices, communication devices, etc.).

According to multiple embodiments, qubit state assignment system 102 can comprise one or more computer and/or machine readable, writable, and/or executable components and/or instructions that, when executed by processor 106, can facilitate performance of operations defined by such component(s) and/or instruction(s). Further, in numerous embodiments, any component associated with qubit state assignment system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, analysis component 108, assignment component 110, and/or any other components associated with qubit state assignment system 102 as disclosed herein (e.g., communicatively, electronically, and/or operatively coupled with and/or employed by qubit state assignment system 102), can comprise such computer and/or machine readable, writable, and/or executable component(s) and/or instruction(s). Consequently, according to numerous embodiments, qubit state assignment system 102 and/or any components associated therewith as disclosed herein, can employ processor 106 to execute such computer and/or machine readable, writable, and/or executable component(s) and/or instruction(s) to facilitate performance of one or more operations described herein with reference to qubit state assignment system 102 and/or any such components associated therewith.

In some embodiments, to implement one or more qubit state assignment operations, qubit state assignment system 102 can facilitate performance of operations executed by and/or associated with analysis component 108, assignment component 110, quantum system 114, readout device 116, qubit 118, external electronic device 124, and/or another component associated with qubit state assignment system 102 as disclosed herein. For example, as described in detail below, qubit state assignment system 102 can facilitate: analyzing responses of a multi-mode readout device coupled to a qubit; analyzing responses of readout devices coupled to a qubit; assigning a readout state of the qubit based on the responses; generating the responses based on simultaneous multi-tone excitation; analyzing the responses based on a Boolean logic analysis, a kernel-integrated response of the responses, a time trajectory of the responses, a linear discriminant analysis, a quadratic discriminant analysis, and/or a support vector machine analysis; assigning the readout state based on a majority vote of the responses; analyzing the responses of the multi-mode readout device electrically coupled to at least one of the qubit or an environment of the qubit based on a defined electrical coupling value; and/or assigning the readout state based on one or more parameters that facilitate a defined qubit readout fidelity, a defined qubit decay time protection, and/or a defined qubit dephasing protection.

According to multiple embodiments, quantum system 114 can comprise a superconducting system. For example, quantum system 114 can comprise a superconducting system including, but not limited to, a quantum computing device (e.g., quantum computer, quantum processor, quantum hardware, etc.), a superconducting chip, a superconducting quantum bit circuit (qubit circuit) fabricated on a semiconductor substrate (e.g., a silicon substrate), a circuit quantum electrodynamic (circuit-QED) system, and/or another superconducting system. In some embodiments, quantum system 114 can comprise a superconducting chip comprising one or more readout devices coupled to one or more qubits. For example, quantum system 114 can comprise a superconducting chip comprising one or more readout devices 116 coupled (e.g., communicatively, electrically, operatively, mechanically, etc.) to one another, and/or to qubit 118, via electrical circuitry 120.

According to numerous embodiments, readout device 116 can comprise a qubit state measurement device that can measure a qubit state of a qubit. For example, readout device 116 can comprise a qubit state measurement device including, but not limited to, a single-mode readout device, a multi-mode readout device, a superconducting resonator, a microwave resonator, a mechanical resonator, and/or another qubit state measurement device. In some embodiments, readout device 116 can comprise a multi-mode readout device such as, for example, a multi-mode microwave resonator, that can measure a qubit state using multiple modes (also referred to herein as channels, tones, harmonics, etc.) simultaneously or sequentially. In some embodiments, readout device 116 can comprise a multi-mode readout device such as, for example, a multi-mode superconducting resonator (e.g., a microwave resonator) having multiple probing taps that can measure a qubit state using multiple modes (e.g., simultaneously or sequentially), where such multiple modes can correspond respectively to such multiple probing taps (e.g., a different mode for each probing tap). In some embodiments, readout device 116 can comprise a single-mode readout device such as, for example, a single-mode microwave resonator, that can measure a qubit state using a single mode (e.g., as described below with reference to readout devices 116a, 116b, 116n and FIG. 2).

In some embodiments, readout device 116 can be coupled to a qubit based on one or more parameters that can facilitate: a defined qubit readout fidelity; a defined qubit decay time protection; and/or a defined qubit dephasing protection. For example, in some embodiments where readout device 116 comprises a multi-mode readout device (e.g., a multi-mode microwave resonator), readout device 116 can be electrically coupled (e.g., capacitively, inductively, etc.) to qubit 118 based on one or more parameters that can facilitate: a defined qubit readout fidelity; a defined qubit decay time protection; and/or a defined qubit dephasing protection.

In some embodiments, such a defined qubit readout fidelity, a defined qubit decay time protection, and/or a defined qubit dephasing protection can constitute an optimal qubit readout fidelity, an optimal qubit decay time protection, and/or an optimal qubit dephasing protection, respectively. In some embodiments, such an optimal qubit readout fidelity, optimal qubit decay time protection, and/or optimal qubit dephasing protection can be determined by employing (e.g., via qubit state assignment system 102) a qubit fidelity function F (e.g., fidelity as a function of measuring time $t_m$) and/or a signal-to-ratio function SNR (e.g., at steady state) such as, for example, equation (1) and/or equation (2) below, respectively.

$$F = \frac{1}{2} e^{\sigma^2/8} e^{-(v_{th}+\tau)/2} \qquad \text{Equation (1)}$$
$$\left\{ \mathrm{erf}\left(\frac{\sigma^2 - 2(v_{th} - \tau)}{2\sqrt{2}\,\sigma}\right) - \mathrm{erf}\left(\frac{\sigma^2 - 2(v_{th} + \tau)}{2\sqrt{2}\,\sigma}\right) \right\}$$

where,
$\tau = t_m / T_1$
$\sigma = \sqrt{\tau_{final}/SNR}$
$v_{th} = 0$ $$SNR = \frac{2\eta \bar{n} \kappa \chi^2}{\kappa^2/4 + \chi^2} T_1 \qquad \text{Equation (2)}$$

In some embodiments, equation (1) and/or equation (2) can correspond to a single mode. In some embodiments, $\bar{n}$ can denote the average number of photons in a single mode measurement, which can be a measure of how strongly each mode is excited. In some embodiments, $\bar{n}$ can be approximately equal to 10 ($\bar{n} \sim 10$). In some embodiments, $\eta$ can denote amplifier efficiency, which can be indicative of how much of the information (e.g., quantum information) is dissipated (e.g., lost) to the environment of a qubit (e.g., qubit 118). In some embodiments, amplifier efficiency $\eta$ can be approximately equal to 0.1 ($\eta \sim 0.1$). In some embodiments, for example, as described below, cavity decay rate $\kappa$ can be approximately equal to 500 kilohertz (kHz) ($\kappa \sim 500$ kHz). In some embodiments, for example, as described below, cavity pull $\chi$ can be approximately equal to 500 kHz ($\chi \sim 500$ kHz). In some embodiments, $\tau$ can denote the measurement time in units of qubit lifetime (T1). In some embodiments, $\tau_{final}$ can denote total measurement time. In some embodiments, $\sigma$ can denote the standard deviation of the measurement signal. In some embodiments, $v_{th}$ can denote temperature of the environment of qubit 118, where $v_{th}=0$ can be indicative of no noise caused by finite temperature. In some embodiments, qubit decay time $T_1$ can be approximately equal to 50 microseconds (μs) ($T_1 \sim 50$ μs).

Figure 5:
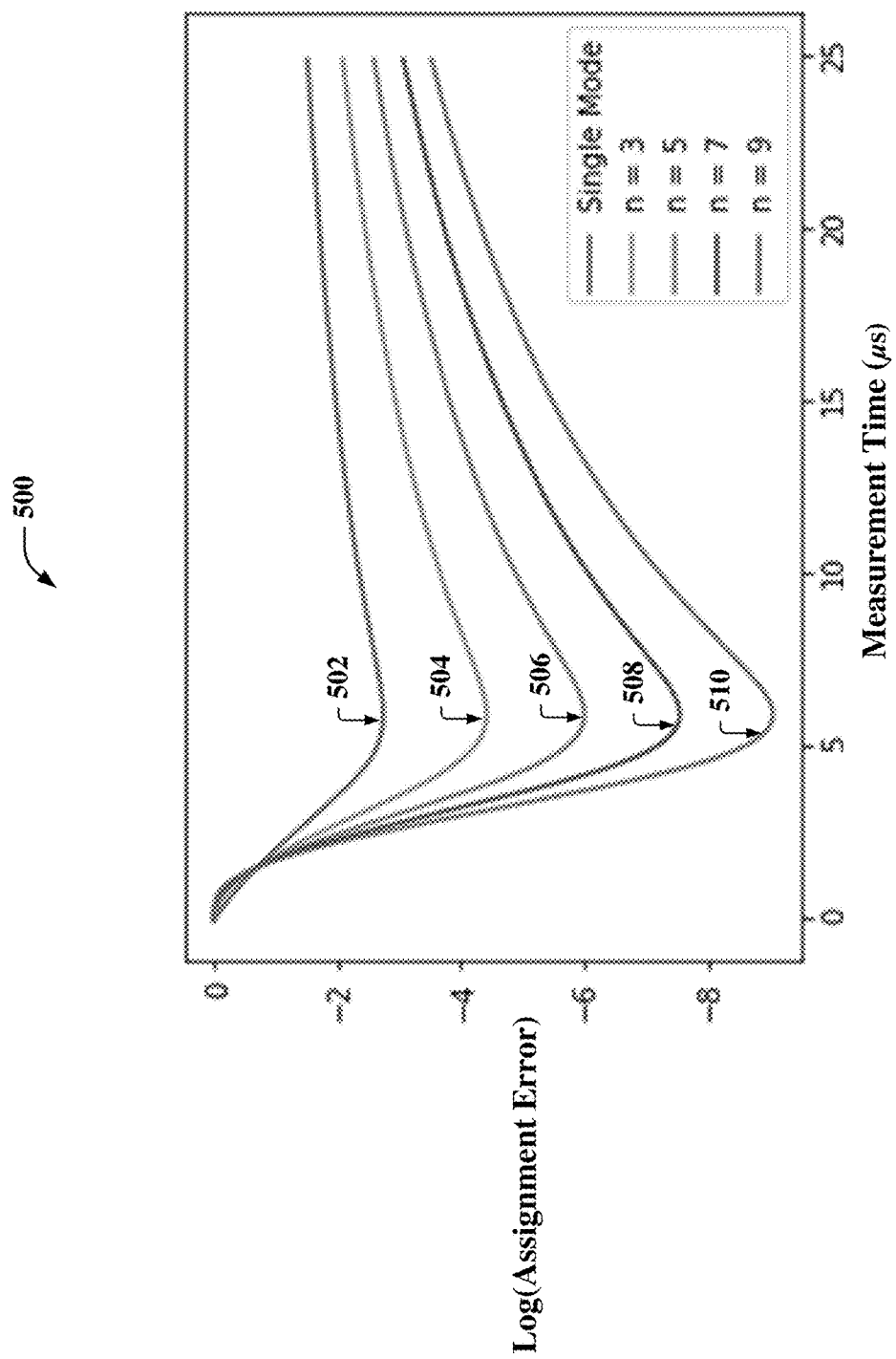
FIG. 5 illustrates an example, non-limiting information that can facilitate multi-mode qubit readout and state assignment components in accordance with one or more embodiments described herein.

In some embodiments, equation (1) can illustrate that information (e.g., quantum information) can be obtained from readout device 116 as function of time and as a function of time, the fidelity (e.g., readout fidelity) can increase (e.g., knowledge of a qubit state can improve) as more and more photons are obtained from readout device 116. In these embodiments, at some point in time, the qubit (e.g., qubit 118) can start decaying, which can cause the readout fidelity to decrease. In these embodiments, a plot of equation (1), for example, as illustrated in FIG. 5, can illustrate how the assignment error can decrease and subsequently increase with continued measuring, which can indicate that there is an optimal time that can minimize the assignment error. In these embodiments, for that optimal time, by increasing the number of modes, assignment error can be reduced, and the measurement time can decrease as well. In some embodiments, equation (1) can illustrate how the information (e.g., quantum information) that can be obtain from a qubit (e.g., qubit state of qubit 118) can change due to qubit decay and/or dephasing.

In some embodiments, an optimal qubit readout fidelity, optimal qubit decay time protection, and/or optimal qubit dephasing protection can be determined by varying (e.g., via qubit state assignment system 102) one or more parameters of equation (1) and/or equation (2) above. For example, such an optimal qubit readout fidelity, optimal qubit decay time protection, and/or optimal qubit dephasing protection can be determined by varying (e.g., via qubit state assignment system 102) one or more parameters of equation (1) and/or equation (2) above including, but not limited to, cavity decay rate $\kappa$, cavity pull $\chi$, and/or another parameter. For instance, to avoid loss of quantum information of a qubit (e.g., qubit 118) via qubit decay (e.g., the rate at which a qubit can decay to the ground state) and/or via dephasing, an entity (e.g., a human user) can employ system 100 and/or qubit state assignment system 102 to select (e.g., via a graphical user interface (GUI) of qubit state assignment system 102) a cavity decay rate κ value and/or a cavity pull χ value of readout device 116 that can facilitate protection of qubit decay time and/or dephasing. In some embodiments, for example, to avoid loss of quantum information of a qubit (e.g., qubit 118) via qubit decay and/or via dephasing, an entity can employ system 100 and/or qubit state assignment system 102 to select a cavity decay rate IC value of approximately 500 kHz and/or a cavity pull χ value of approximately 500 kHz, which can facilitate protection of qubit decay time and/or dephasing, respectively. In these embodiments, such cavity decay rate IC value and/or cavity pull χ value can facilitate optimal qubit readout fidelity, optimal qubit decay time protection, and/or optimal qubit dephasing protection.

In some embodiments, selection of certain parameters of equation (1) and/or equation (2) above (e.g., cavity decay rate κ, cavity pull χ, etc.) can dictate how much readout device 116 can be electrically coupled (e.g., capacitively, inductively, etc.) to the environment and/or how much it can be electrically coupled (e.g., capacitively, inductively, etc.) to qubit 118. As referenced herein, an environment of a qubit can be defined as everything that is not part of a quantum system comprising such a qubit. For example, as referenced herein, an environment of a qubit can comprise all possible leakage channels to any location the qubit information (e.g., quantum information) can exist that is not part of the quantum system. In another example, as referenced herein, an environment of a qubit can comprise a noisy thermal background that can be a path of incoherent radiation.

In some embodiments, some parameters of equation (1) and/or equation (2) above (e.g., cavity decay rate κ, cavity pull χ, etc.) can facilitate obtaining information from qubit 118 at a rate that is favorable compared to a rate at which qubit 118 can lose (e.g., release, relax, etc.) the information to an environment of qubit 118 in a manner that can prevent obtaining such information (e.g., via readout device 116). For instance, a qubit (e.g., qubit 118) can have an intrinsic qubit decay time $T_1$, and therefore, such a qubit can lose energy (e.g., quantum information) even without being electrically coupled to a readout device (e.g., readout device 116). Consequently, in some embodiments, an entity (e.g., via a GUI of qubit state assignment system 102 as described above) can select values of certain parameters of equation (1) and/or equation (2) above (e.g., cavity decay rate κ, cavity pull χ, etc.) that can facilitate limiting additional loss of energy (e.g., quantum information) caused by electrically coupling such a qubit (e.g., qubit 118) to readout device 116 and/or can facilitate limiting dephasing. In these embodiments, such an entity can select values of certain parameters (e.g., optimal values of certain parameters) of equation (1) and/or equation (2) above that can facilitate striking a balance between the qubit decay rate $T_1$ and the dephasing, as some parameters favor limited qubit decay rate $T_1$, while other parameters favor limited dephasing.

In some embodiments, readout device 116 can be coupled to a qubit and/or an environment of such a qubit based on a defined electrical coupling value. For example, in embodiments where readout device 116 comprises a multi-mode readout device (e.g., a multi-mode microwave resonator), readout device 116 can be electrically coupled (e.g., capacitively, inductively, etc.) to qubit 118 and/or an environment of qubit 118 based on a defined electrical coupling value. For instance, readout device 116 can be electrically coupled to qubit 118 based on a cavity pull χ value of approximately 500 kHz, which can constitute a weak electrical coupling of readout device 116 to qubit 118. In another example, readout device 116 can be electrically coupled to qubit 118 based on a cavity decay rate κ value of approximately 500 kHz, which can constitute a weak electrical coupling of readout device 116 to an environment of qubit 118.

According to several embodiments, qubit 118 can comprise various types of quantum bits (qubits). For example, qubit 118 can comprise a qubit including, but not limited to, a transmon qubit, charge qubit, flux qubit, phase qubit, and/or another type of qubit. In some embodiments, qubit 118 can comprise a qubit having one or more Josephson junctions. As referenced herein, a Josephson junction can comprise a superconducting component that manifest the Josephson effect of a supercurrent, where current can flow indefinitely across a Josephson junction without an applied voltage. For example, a Josephson junction can be created by weakly coupling (e.g., communicatively, electrically, operatively, etc.) two superconductors (e.g., capacitive pads) using a tunnel barrier (or tunnel layer) that can comprise a non-superconducting, non-conductive material such as, for example, aluminum oxide ($Al_2O_3$).

According to multiple embodiments, electrical circuitry 120 can comprise electrically conductive components through which electrical current and/or electrical signals can flow. For example, electrical circuitry 120 can comprise electrically conductive components including, but not limited to, wires, traces, capacitors, transistors, resistors, diodes, and/or other components through which electrical current (e.g., alternating current and/or direct current) and/or electrical signals (e.g., microwave frequency signals) can flow. In another example, electrical circuitry 120 can comprise a bus including, but not limited to, bus 112, a resonant bus, and/or another type of bus. In numerous embodiments, electrical circuitry 120 can facilitate various operations (e.g., transferring, storing, and/or altering electrical current, electrical signals, and/or electrical data) of quantum system 114, readout device 116, qubit 118, and/or components coupled therewith (e.g., qubit state assignment system 102, analysis component 108, assignment component 110, etc.).

According to numerous embodiments, linear passive microwave structure 122 can comprise a linear passive microwave structure that can facilitate transmission of microwave frequency signals. For example, linear passive microwave structure 122 can comprise a coaxial cable (e.g., a 50 Ohm (Ω) cable), a transmission line, a bus (e.g., a resonant bus), a waveguide, and/or another linear passive microwave structure.

According to multiple embodiments, external electronic device 124 can comprise any external electronic device that can transmit microwave signals at one or more frequencies (e.g., single-tone, multi-tone) and/or receive reflected microwave signals at such one or more frequencies. For example, external electronic device 124 can comprise a vector network analyzer (VNA) that can transmit (e.g., via linear passive microwave structure 122) microwave signals at a single frequency or at multiple frequencies to quantum system 114, readout device 116, and/or qubit 118. In this example, qubit state assignment system 102 and/or external electronic device 124 can receive microwave signals at a single frequency or at multiple frequencies, where such microwave signals can be reflected by quantum system 114, readout device 116, and/or qubit 118. In this example, such transmission of microwave signals by external electronic device 124 at a single frequency or at multiple frequencies can constitute probing qubit 118. Although FIG. 1 illustrates external electronic device 124 as a remote device (e.g., external to qubit state assignment system 102 and/or quantum system 114), it should be appreciated that the subject disclosure is not so limiting. For example, in some embodiments, qubit state assignment system 102 can comprise external electronic device 124.

In some embodiments, qubit state assignment system 102 can employ external electronic device 124 to probe qubit 118 as described above, where such probing can be based on the defined qubit readout fidelity, defined qubit decay time protection, defined qubit dephasing protection, and/or defined electrical coupling that can be determined as described above. In these embodiments, based on such probing, qubit state assignment system 102 and/or components thereof can receive reflected microwave signals from quantum system 114, readout device 116, and/or qubit 118 that correspond to such probing. In these embodiments, analysis component 108 can analyze such reflected microwave signals (e.g., via analyzing responses of readout device 116 as described below). In these embodiments, assignment component 110 can assign a readout state of qubit 118 (e.g., a qubit state) based on such an analysis performed by analysis component 108. In these embodiments, such an assignment of a readout state of qubit 118 by assignment component 110 can constitute assigning the readout state based on a defined qubit readout fidelity, a defined qubit decay time protection, and/or a defined qubit dephasing protection.

According to multiple embodiments, analysis component 108 can analyze responses of a multi-mode readout device coupled to a qubit. As referenced herein, such responses can include, but are not limited to, qubit responses, dispersive readouts of a qubit, qubit state information, quantum information, qubit logic state, qubit response functions, microwave port responses, admittance functions (matrices), multiport admittance functions (matrices), impedance functions (matrices), and/or another response. In some embodiments, analysis component 108 can analyze responses of a multi-mode readout device that can facilitate probing a qubit in a parallel manner using multiple modes (e.g., different modes) simultaneously or sequentially, where such simultaneous and/or sequential parallel probing of the qubit can provide different readout responses corresponding to each of the multiple modes. For instance, analysis component 108 can analyze responses of readout device 116, where readout device 116 can comprise a multi-mode readout device (e.g., a multi-mode microwave resonator) that can facilitate probing qubit 118 based on simultaneous or sequential excitation of the multiple modes of readout device 116 (also referred to herein as simultaneous multi-tone excitation and/or sequential multi-tone excitation).

In some embodiments, as illustrated in FIG. 1, readout device 116 can comprise a single multi-mode readout device (e.g., a multi-mode microwave resonator) that can comprise multiple harmonics (e.g., modes, tones, channels, etc.), where each of such harmonics can be employed separately by stimulating readout device 116 at multiple different frequencies. In these embodiments, such stimulating can occur simultaneously or sequentially. In some embodiments, to facilitate such stimulating of readout device 116, system 100 and/or qubit state assignment system 102 can employ external electronic device 124 (e.g., a VNA) to transmit (e.g., via linear passive microwave structure 122) microwave signals at multiple frequencies to quantum system 114, readout device 116, and/or qubit 118. In these embodiments, such transmission of microwave signals by external electronic device 124 at multiple frequencies can constitute probing qubit 118.

In some embodiments, based on such probing of qubit 118 as described above, qubit state assignment system 102 and/or components thereof (e.g., analysis component 108) can receive reflected microwave signals at such multiple frequencies, where such microwave signals can be reflected by quantum system 114, readout device 116, and/or qubit 118. In these embodiments, based on qubit state assignment system 102 and/or analysis component 108 receiving such microwave signals at such multiple frequencies, analysis component 108 can analyze the responses of the multi-modes individually and/or collectively using one or more analysis technique described below.

In some embodiments, analysis component 108 can analyze responses of the multi-modes individually to determine a qubit state decision corresponding to each individual mode response. In these embodiments, assignment component 110 can assign a readout state of a qubit (e.g., a qubit state) based on the responses and/or an analysis of such individual qubit state decisions. For example, assignment component 110 can assign a qubit state of qubit 118 by selecting one of such individual qubit state decisions to be the qubit state of qubit 118. For instance, assignment component 110 can select an individual qubit state decision comprising a defined criterion or criteria. In this example, assignment component 110 can select, for example, an individual qubit state decision comprising defined criteria including, but not limited to, a defined Boolean value (e.g., 0 or 1), a defined level of fidelity (e.g., high fidelity and/or the highest fidelity amongst all such individual qubit state decisions), another defined criterion, and/or a combination of any such defined criteria.

In some embodiments, assignment component 110 can assign a readout state of a qubit (e.g., a qubit state) based on a majority vote of the responses. For example, based on analysis component 108 determining a qubit state decision corresponding to each individual mode response as described above, assignment component 110 can assign a readout state of qubit 118 (e.g., a qubit state) by applying a majority vote approach to such individual qubit state decisions. For instance, where more than half (e.g., more than 50 percent (50%)) of the individual qubit state decisions comprise a certain decision, thereby constituting a majority vote, assignment component 110 can assign such decision to be the readout state of qubit 118 (e.g., a qubit state).

In some embodiments, analysis component 108 can analyze the multi-mode responses by analyzing such responses collectively. For example, analysis component 108 can analyze the entirety of the multi-mode responses, as opposed to analyzing each individual mode response and/or the qubit state decision corresponding to each individual mode as described above.

In some embodiments, analysis component 108 can analyze the entirety of the multi-mode responses by analyzing an integrated response (e.g., a kernel-integrated response) of all the individual mode responses. For example, analysis component 108 can analyze the entirety of the multi-mode responses by employing a non-linear discrimination analysis, where kernel weighted responses corresponding to the individual mode responses can be used as input to such analysis. For instance, analysis component 108 can analyze the entirety of the multi-mode responses by employing a non-linear discrimination analysis including, but not limited to, a linear discriminant analysis (LDA), a quadratic discriminant analysis (QDA), a support vector machine (SVM, also referred to as state vector machine), and/or another non-linear discrimination analysis.

In some embodiments, analysis component 108 can analyze the entirety of the multi-mode responses by analyzing a full time trajectory of each individual mode response (e.g., as opposed to an integrated response as described above). For example, analysis component 108 can analyze the entirety of the multi-mode responses by employing a non-linear discrimination analysis, where a full time trajectories corresponding to the individual mode responses can be used as inputs to such analysis. For instance, analysis component 108 can analyze the entirety of the multi-mode responses by employing one or more of the non-linear discrimination analyses described above (e.g., LDA, QDA, SVM, etc.), using full time trajectories corresponding to the individual mode responses as inputs to such analysis.

In some embodiments, assignment component 110 can assign a readout state of a qubit (e.g., a qubit state) based on the responses and/or an output of an analysis process that can be employed by analysis component 108 to analyze the entirety of the multi-mode responses. For example, assignment component 110 can assign a readout state of a qubit based on an output of such non-linear discrimination analysis that can be employed by analysis component 108 to analyze the entirety of the multi-mode responses as described above (e.g., LDA, QDA, SVM). In this example, assignment component 110 can assign a readout state of a qubit based on kernel-integrated responses corresponding to the individual mode responses (e.g., real numbers such as, for instance, voltage values, integrated voltage values, etc.) and/or full time trajectories corresponding to the individual mode responses (e.g., functions of time such as, for instance, f(t) or voltage values as a function of time V(t), etc.). For instance, assignment component 110 can assign a readout state of qubit 118 by selecting an output of such a non-linear discrimination analysis that comprises a defined criterion or criteria (e.g., defined voltage values, defined voltage values as a function of time V(t), etc.).

Figure 2:
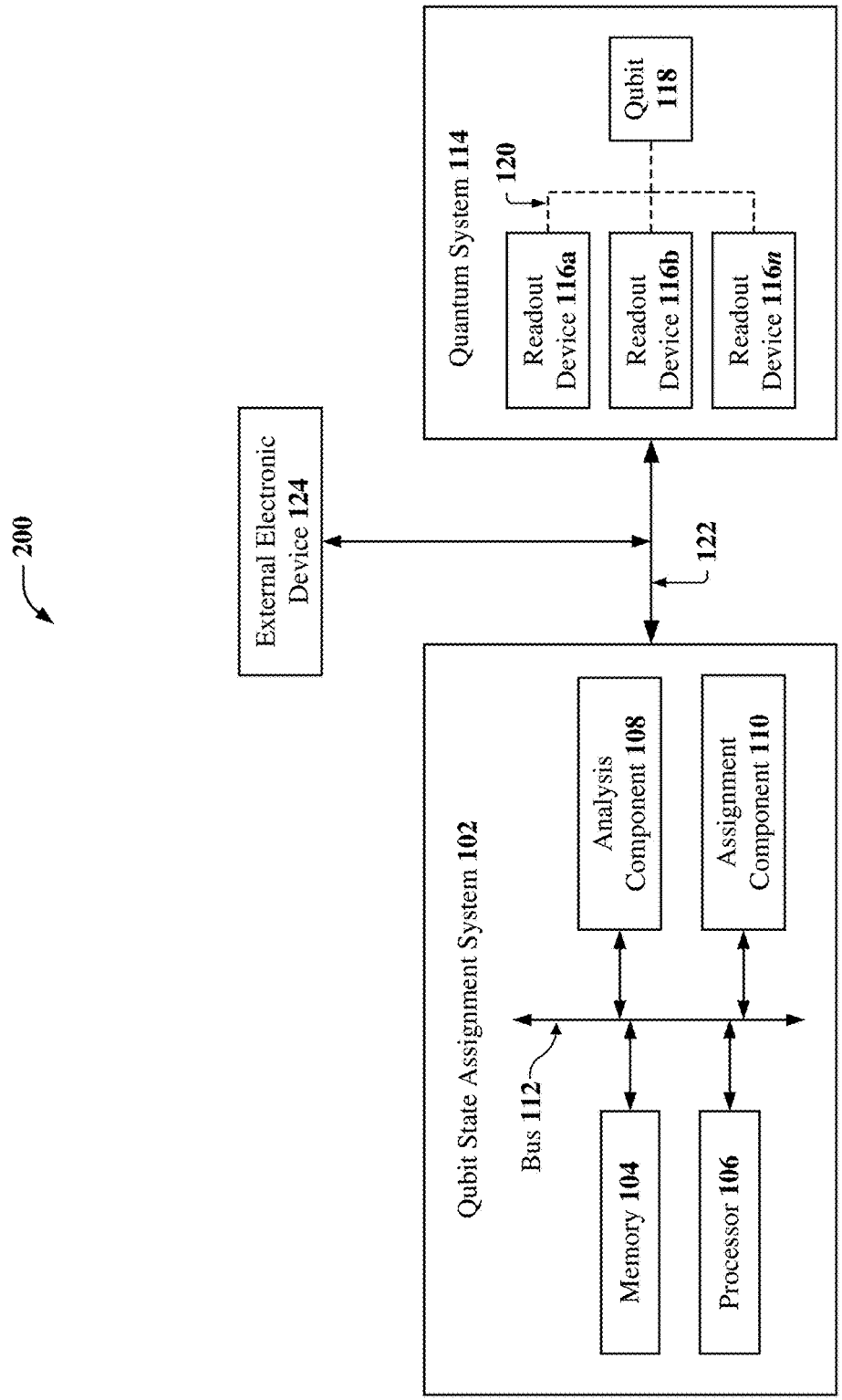
FIG. 2 illustrates a block diagram of an example, non-limiting system that can facilitate multi-mode qubit readout and state assignment components in accordance with one or more embodiments described herein.

FIG. 2 illustrates a block diagram of an example, non-limiting system 200 that can facilitate multi-mode qubit readout and state assignment components in accordance with one or more embodiments described herein. Repetitive description of like elements and/or processes employed in respective embodiments is omitted for sake of brevity.

According to multiple embodiments, system 200 can comprise an example, non-limiting alternative embodiment of system 100. In such embodiments, quantum system 114 of system 200 can comprise multiple readout devices 116a, 116b, 116n that can be electrically coupled (e.g., capacitively, inductively, etc.) to qubit 118, where n can represent a total quantity of readout devices 116 that can be coupled to qubit 118. In these embodiments, readout devices 116a, 116b, 116n can comprise single-mode readout devices, where each device can operate using a single mode (e.g., channel, harmonic, tone, etc.) that is different from that of all other readout devices 116a, 116b, 116n.

In some embodiments, analysis component 108 can analyze the responses of such readout devices 116a, 116b, 116n electrically coupled to qubit 118. For example, based on probing qubit 118 (e.g., via external electronic device 124) and/or receiving reflected microwave signals based on such probing (e.g., reflected microwave signals received by qubit state assignment system 102 and/or components thereof), analysis component 108 can analyze the responses of each mode corresponding to each readout device 116a, 116b, 116n individually and/or collectively using one or more analysis technique described above with reference to FIG. 1 (e.g., selection of an individual qubit state decision, majority vote, LDA, QDA, SVM, etc.). In this example, assignment component 110 can assign a readout state of qubit 118 based on such responses and/or an output of an analysis performed by analysis component 108 (e.g., as described above with reference to FIG. 1).

Figure 3:
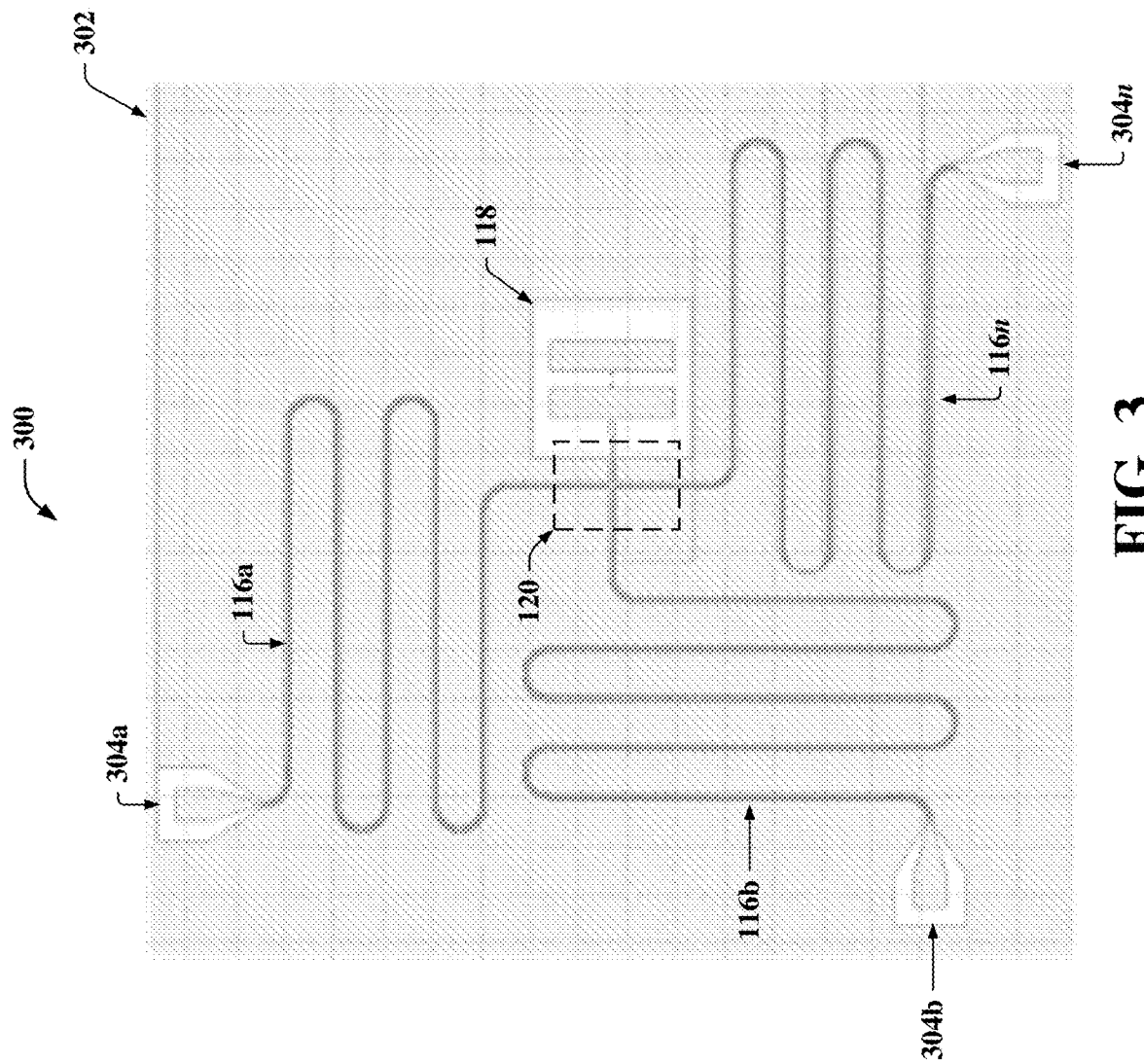
FIG. 3 illustrates a top view of an example, non-limiting system that can facilitate multi-mode qubit readout and state assignment components in accordance with one or more embodiments described herein.

FIG. 3 illustrates a top view of an example, non-limiting system 300 that can facilitate multi-mode qubit readout and state assignment components in accordance with one or more embodiments described herein. Repetitive description of like elements and/or processes employed in respective embodiments is omitted for sake of brevity.

According to multiple embodiments, system 300 can comprise an embodiment of quantum system 114 described above with reference to FIG. 1, where such an embodiment of quantum system 114 can comprise a superconducting chip 302. In some embodiments, superconducting chip 302 can comprise multiple readout devices 116a, 116b, 116n, qubit 118, and/or one or more ports 304a, 304b, 304n, where such readout devices 116a, 116b, 116n can be coupled (e.g., electrically, communicatively, operatively, mechanically, etc.) to one another, and/or qubit 118, via electrical circuitry 120. In some embodiments, ports 304a, 304b, 304n can be coupled (e.g., electrically, communicatively, operatively, mechanically, etc.) to readout devices 116a, 116b, 116n, respectively. In some embodiments, ports 304a, 304b, 304n can also be coupled to qubit state assignment system 102 and/or external electronic device 124 (e.g., via linear passive microwave structure 122). In some embodiments, ports 304a, 304b, 304n can facilitate probing qubit 118 (e.g., via external electronic device 124 as described above with reference to FIG. 1) and/or capturing (e.g., obtaining, measuring, analyzing, etc.) readout responses of readout devices 116a, 116b, 116n based on such probing (e.g., via qubit state assignment system 102 and/or components thereof as described above with reference to FIG. 1).

In some embodiments, superconducting chip 302 can comprise a superconducting circuit that can be implemented on a semiconducting substrate. For example, superconducting chip 302 can comprise a superconducting circuit (e.g., a quantum circuit, an integrated quantum circuit, etc.) that can be implemented on a semiconducting substrate (e.g., a silicon substrate) utilizing one or more semiconductor substrate fabrication techniques. For instance, superconducting chip 302 and/or components thereof can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), physical vapor deposition (PVD), chemical vapor deposition (CVD), atomic layer deposition (ALD), plasma enhanced chemical vapor deposition (PECVD), chemical solution deposition, electroplating, molecular beam epitaxy (MBE), electrochemical deposition (ECD), lift-off techniques, chemical-mechanical planarization (CMP), backgrinding techniques, and/or another technique for fabricating an integrated circuit.

In some embodiments, fabrication of superconducting chip 302 and/or components thereof can be performed using various materials. For example, superconducting chip 302 and/or components thereof can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 4:
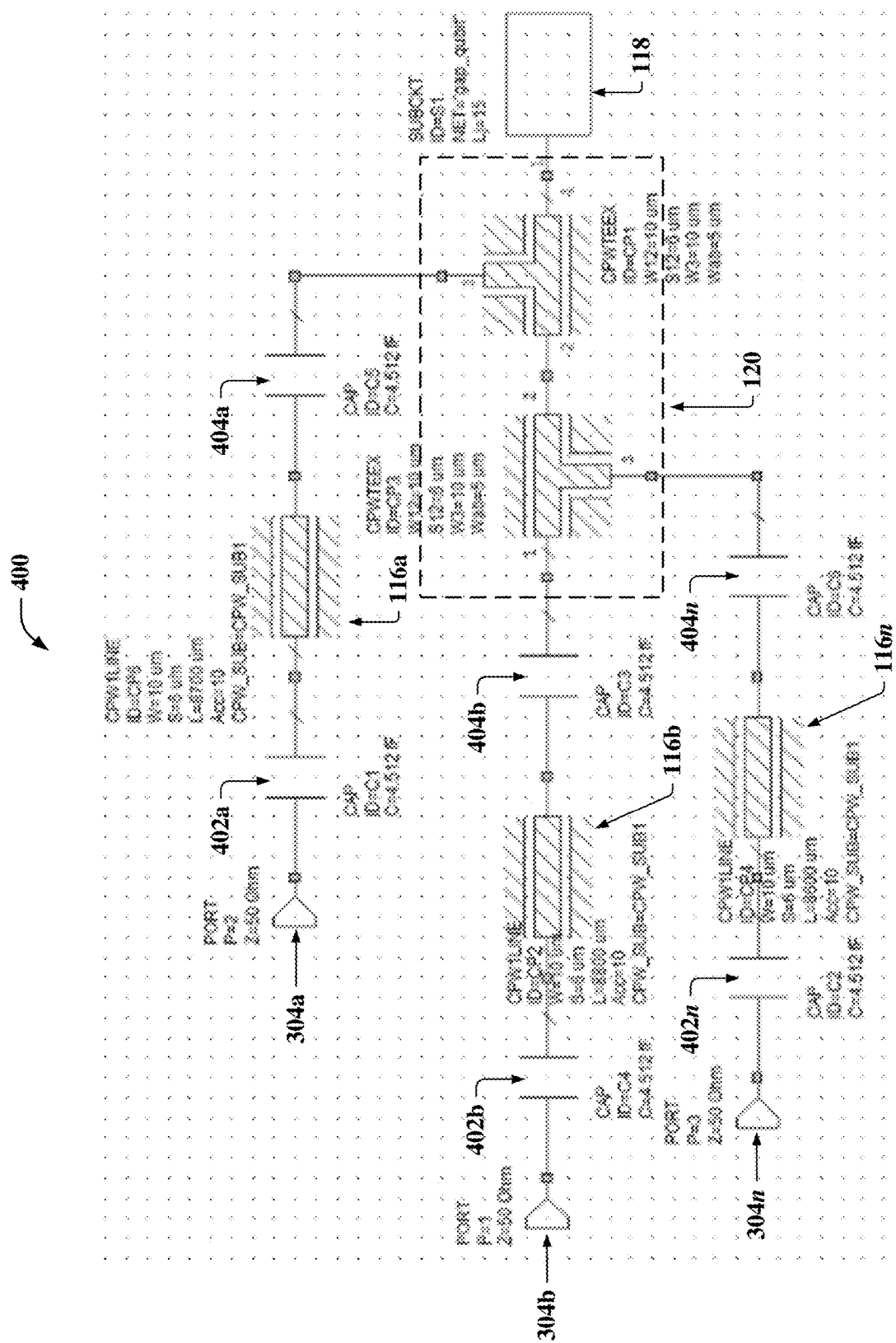
FIG. 4 illustrates an electrical schematic of an example, non-limiting system that can facilitate multi-mode qubit readout and state assignment components in accordance with one or more embodiments described herein.

FIG. 4 illustrates an electrical schematic of an example, non-limiting system 400 that can facilitate multi-mode qubit readout and state assignment components in accordance with one or more embodiments described herein. Repetitive description of like elements and/or processes employed in respective embodiments is omitted for sake of brevity.

According to multiple embodiments, system 400 can comprise an embodiment of superconducting chip 302 described above with reference to FIG. 3, where FIG. 4 can comprise an example, non-limiting electrical schematic topology of such an embodiment of superconducting chip 302. In some embodiments, system 400 can comprise one or more environment capacitors 402a, 402b, 402n and/or one or more qubit capacitors 404a, 404b, 404n, where n can represent a total respective quantity of such capacitors.

In some embodiments, environment capacitors 402a, 402b, 402n can be coupled (e.g., electrically, communicatively, operatively, mechanically, etc.) to ports 304a, 304b, 304n, respectively. In some embodiments, environment capacitors 402a, 402b, 402n can also be coupled (e.g., electrically, communicatively, operatively, mechanically, etc.) to readout devices 116a, 116b, 116n, respectively. In some embodiments, environment capacitors 402a, 402b, 402n can facilitate defining (e.g., setting) the electrical coupling of readout devices 116a, 116b, 116n, respectively, to the environment of qubit 118, where such electrical coupling can be based on cavity decay rate κ. In some embodiments, such electrical coupling of readout devices 116a, 116b, 116n to the environment of qubit 118 can be tuned by adjusting (e.g., via an entity such as, for example, a human user via a GUI of qubit state assignment system 102) environment capacitors 402a, 402b, 402n (e.g., via varying a value of cavity decay rate κ).

In some embodiments, qubit capacitors 404a, 404b, 404n can be coupled (e.g., electrically, communicatively, operatively, mechanically, etc.) to readout devices 116a, 116b, 116n, respectively. In some embodiments, qubit capacitors 404a, 404b, 404n can also be coupled (e.g., electrically, communicatively, operatively, mechanically, etc.) to qubit 118 (e.g., via electrical circuitry 120). In some embodiments, qubit capacitors 404a, 404b, 404n can facilitate decoupling line resonances (e.g., line resonances of system 400 and/or readout devices 116a, 116b, 116n). In some embodiments, qubit capacitors 404a, 404b, 404n can facilitate defining (e.g., setting) the electrical coupling of readout devices 116a, 116b, 116n, respectively, to qubit 118, where such electrical coupling can be based on cavity pull χ. In some embodiments, such electrical coupling of readout devices 116a, 116b, 116n to qubit 118 can be tuned by adjusting (e.g., via an entity such as, for example, a human user via a GUI of qubit state assignment system 102) qubit capacitors 404a, 404b, 404n (e.g., via varying a value of cavity pull χ).

In some embodiments, system 400 can comprise an equivalent circuit that can be implemented to facilitate probing and/or measuring a qubit readout state using one or more readout devices (e.g., readout device 116 and/or readout devices 116a, 116b, 116n). In some embodiments, system 400 can illustrate how readout devices 116a, 116b, 116n can be coupled (e.g., electrically) together and collectively coupled (e.g., electrically) to a qubit (e.g., qubit 118), for example, using environment capacitors 402a, 402b, 402n and/or qubit capacitors 404a, 404b, 404n illustrated in FIG. 4. In some embodiments, for example, where system 400 comprises an equivalent circuit, such a circuit can be created after completion of an electromagnetic simulation (e.g., via qubit state assignment system 102) that can be employed to determine such an equivalent circuit that can facilitate probing and/or measuring a qubit readout state as described herein in accordance with one or more embodiments of the subject disclosure.

FIG. 5 illustrates an example, non-limiting information 500 that can facilitate multi-mode qubit readout and state assignment components in accordance with one or more embodiments described herein. Repetitive description of like elements and/or processes employed in respective embodiments is omitted for sake of brevity.

According to multiple embodiments, information 500 can comprise a plot of equation (1) described above with reference to FIG. 1. In some embodiments, information 500 can illustrate how the assignment error can decrease and subsequently increase with continued measuring of one or more modes, which can indicate that there is an optimal time that can minimize the assignment error. In these embodiments, for that optimal time, by increasing the number of modes, assignment error can be reduced, and the measurement time can decrease as well. In these embodiments, line plot 502 can comprise one (1) mode, line plot 504 can comprise three (3) modes, line plot 506 can comprise five (5) modes, line plot 508 can comprise seven (7) modes, and/or line plot 510 can comprise nine (9) modes.

Figure 6:
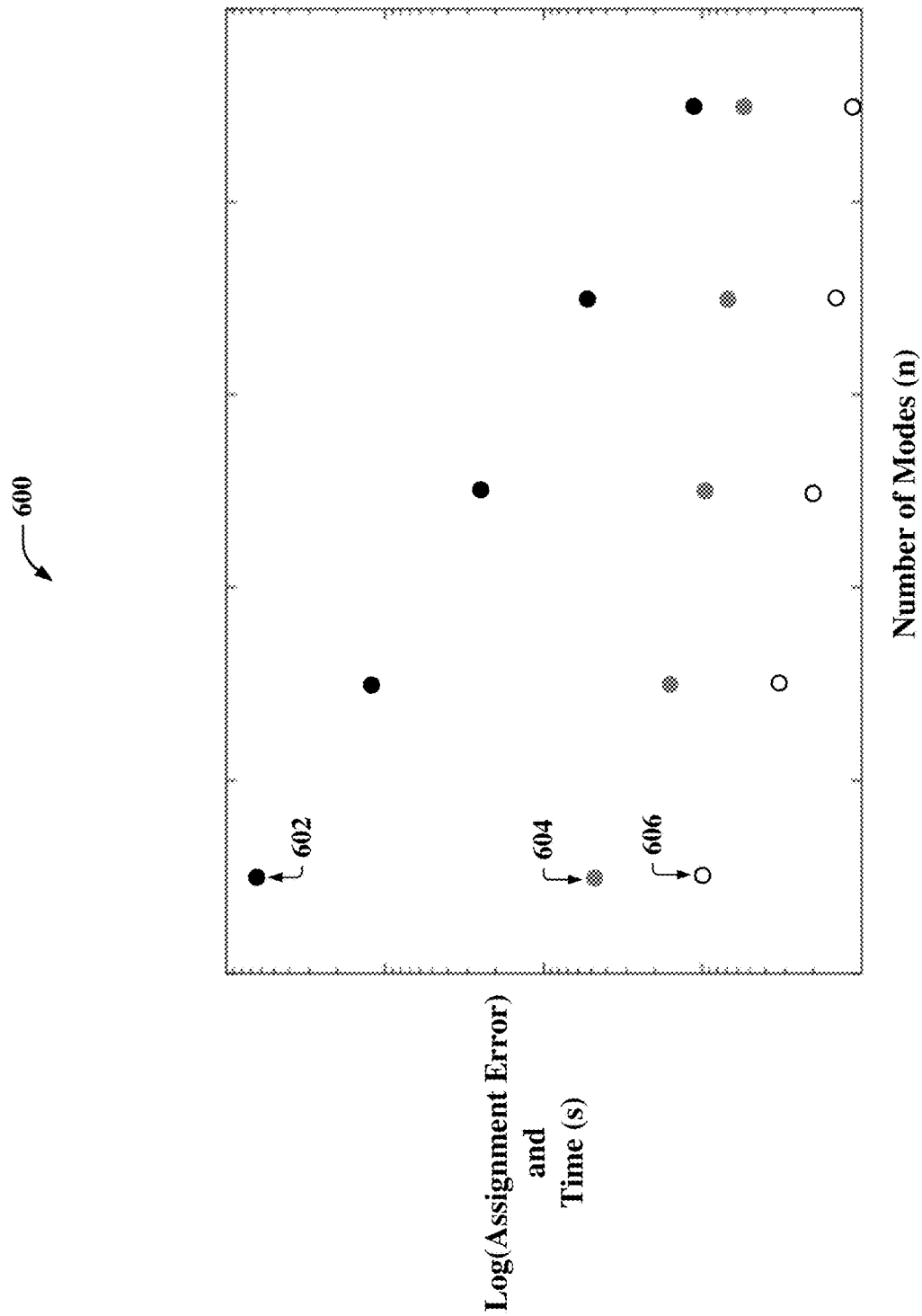
FIG. 6 illustrates example, non-limiting information that can facilitate multi-mode qubit readout and state assignment components in accordance with one or more embodiments described herein.

FIG. 6 illustrates example, non-limiting information 600 that can facilitate multi-mode qubit readout and state assignment components in accordance with one or more embodiments described herein. Repetitive description of like elements and/or processes employed in respective embodiments is omitted for sake of brevity.

According to multiple embodiments, information 600 can comprise a logarithmic (log) scale, where the x-axis can represent the number of modes n of readout device 116 and the y-axis can comprise two (2) separate values overlaid on one another. For example, the y-axis of information 600 can comprise: a first value representing the log of the assignment error (e.g., the log of the readout error and/or the log of the readout measurement), which can correspond to the black dots 602 depicted in FIG. 6; and a second value representing time (e.g., seconds), which can correspond to qubit decay time represented by the gray dots 604 in FIG. 6 and/or dephasing time represented by the white dots 606 in FIG. 6.

In some embodiments, information 600 can be based on the assumptions defined below, where Γ can denote rate, $\Gamma_{T_1}$ can denote the rate of qubit decay, φ can denote dephasing, and/or $\Gamma_\varphi$ can denote the rate of qubit dephasing. In some embodiments, information 600 can be based on one (1) mode $\Gamma_{T_1}^{(m)} = m\Gamma_{T_1}^{(1)}$ and/or $\Gamma_\varphi^{(m)} = m\Gamma_\varphi^{(1)}$, where m can denote the number of readout modes.

Assumptions:
$\Gamma_\varphi^{(1)} = \Gamma_2 - \Gamma_1/2$
$\Gamma_2 = 1/50\ \mu s$
$\Gamma_1 = 1/50\ \mu s$
$\Gamma_{T_1}^{(1)} \sim \Delta/2\kappa\chi$ In some embodiments, information 600 can illustrate how qubit decay and/or dephasing can evolve as a function of the number of modes n of readout device 116 (e.g., number of channels, tones, harmonics, etc.). For example, as illustrated by information 600, qubit decay and/or dephasing can grow (e.g., increase) at a slower rate than that at which the readout fidelity (e.g., the quantum information that can be obtained from the readout) can grow. For instance, as illustrated by information 600, the slope of the black dots 602 can be steeper than that of the gray dots 604 and/or the white dots 606, which can be indicative of the assignment error decaying faster in the readout (e.g., readout response) than the amount of error caused by qubit decay and/or dephasing that can be induced by the readout process.

In some embodiments, time values represented on the y-axis of information 600 (e.g., qubit decay time and/or dephasing time) can represent the total decay time exerted on a qubit (e.g., qubit 118) due to the readout process. In these embodiments, as illustrated by information 600, as the number of modes n increases, such time values can decrease due to introduction of additional modes (e.g., channels) for the qubit to relax.

In some embodiments, the decreasing slope of the gray dots 604 and/or the white dots 606 can be indicative of the qubit decay and/or the dephasing increasing because the time is getting shorter. In these embodiments, however, such increasing qubit decay and/or dephasing can occur at a much slower rate than the rate at which the readout error is decreasing, as illustrated by information 600 (e.g., the decreasing slope of the black dots 602 compared to that of the gray dots 604 and white dots 606). In some embodiments, information 600 can illustrate that the rate at which the slopes of the gray dots 604 and the white dots 606 decrease is slower than the rate at which the slope of the black dots 602 decreases. In some embodiments, as illustrated by information 600, by employing multiple modes n (e.g., nine (9) modes as illustrated in FIG. 5) the black dots 602 can decrease approximately three (3) orders of magnitude, whereas the gray dots 604 and the white dots 606 can decrease approximately one (1) order of magnitude.

Figure 7:
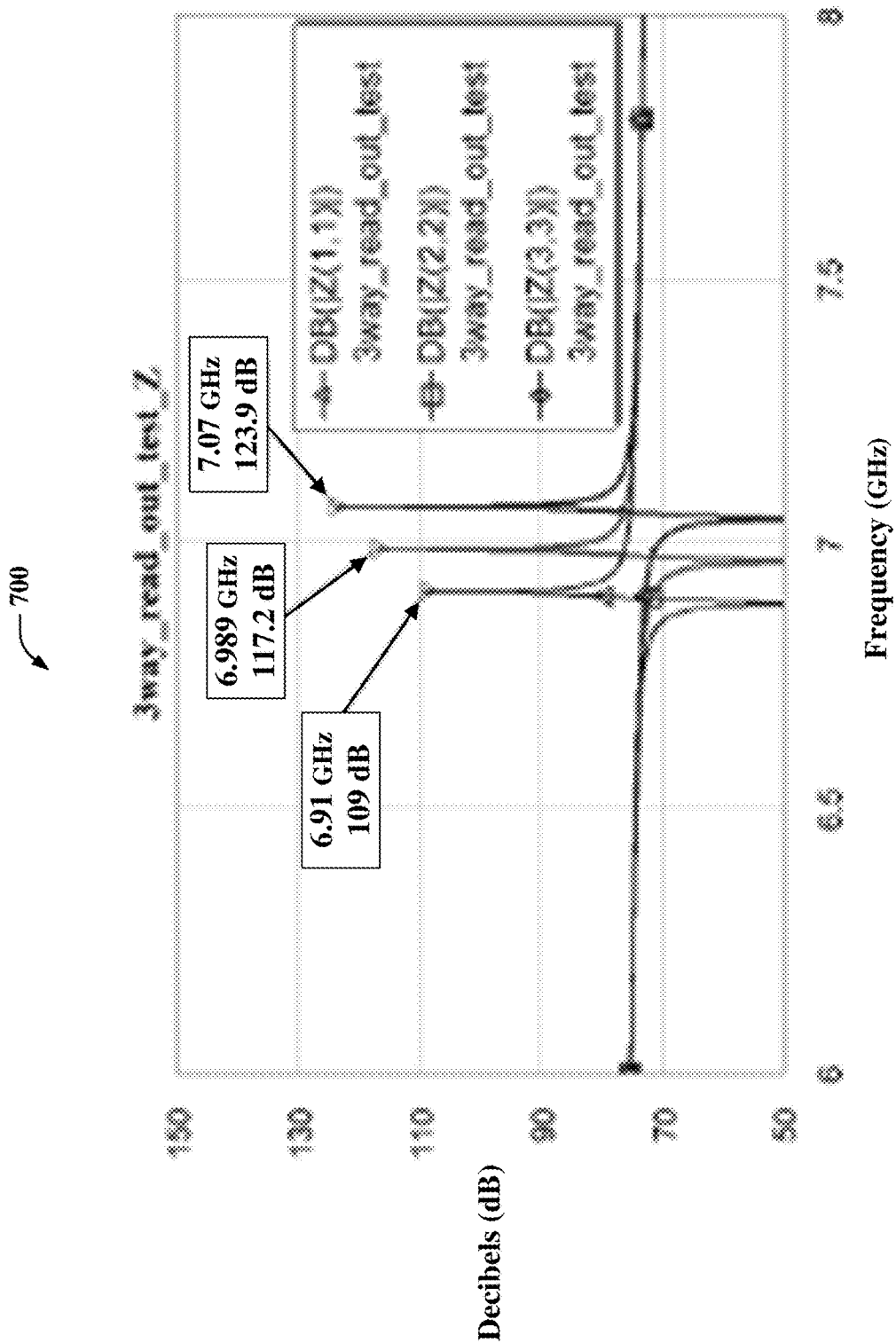
FIG. 7 illustrates an example, non-limiting information that can facilitate multi-mode qubit readout and state assignment components in accordance with one or more embodiments described herein.

FIG. 7 illustrates an example, non-limiting information 700 that can facilitate multi-mode qubit readout and state assignment components in accordance with one or more embodiments described herein. Repetitive description of like elements and/or processes employed in respective embodiments is omitted for sake of brevity.

According to multiple embodiments, information 700 illustrates three (3) individual modes of, for example, three (3) readout devices, where the individual modes can resonate at shifted frequencies (e.g., 6.91 gigahertz (GHz), 6.989 GHz, and 7.07 GHz) that the readout devices can probe independently and/or simultaneously. In some embodiments, information 700 can represent the resonance of each readout device (e.g., readout devices 116a, 116b, 116n described above with reference to FIGS. 2, 3, and 4) and/or each mode of a multi-mode readout device (e.g., readout device 116 described above with reference to FIG. 1) illustrated as a signal power in decibels (dB) represented along the y-axis and a frequency (GHz) represented along the x-axis. In some embodiments, information 700 can illustrate that the subject disclosure (e.g., via qubit state assignment system 102, external electronic device 124, etc.) can excite (e.g., simultaneously and/or independently) such readout device(s) at approximately the frequencies illustrated in FIG. 7 to obtain information (e.g., quantum information) about a qubit (e.g., a readout state of qubit 118).

In some embodiments, qubit state assignment system 102 can be a multi-mode qubit readout and state assignment system and/or process associated with various technologies. For example, qubit state assignment system 102 can be associated with superconducting quantum circuit technologies, quantum bit (qubit) technologies, circuit quantum electrodynamics (circuit-QED) technologies, quantum computing technologies, scalable quantum computing architecture technologies, surface code architecture technologies, surface code error correction architecture technologies, quantum hardware technologies, and/or other technologies.

In some embodiments, qubit state assignment system 102 can provide technical improvements to systems, devices, components, operational steps, and/or processing steps associated with the various technologies identified above. For example, qubit state assignment system 102 can facilitate providing improved qubit readout fidelity by using multiple modes of a readout device (e.g., readout device 116) and/or different individual modes of multiple readout devices (e.g., readout devices 116a, 116b, 116n), as well as the response analysis and/or qubit state assignment techniques described herein (e.g., performed by analysis component 108 and/or assignment component 110, respectively). In this example, qubit state assignment system 102 can facilitate providing such improved qubit readout fidelity without incurring penalties associated with increasing qubit readout performance such as, for example, increased Purcell effect (e.g., increased qubit decay) and/or increased dephasing. In this example, qubit state assignment system 102 can facilitate providing such improved qubit readout fidelity without incurring such penalties associated with increasing qubit readout performance and without employing a bulky and/or strongly coupled (e.g., to qubit 118) separate Purcell filter.

In some embodiments, qubit state assignment system 102 can provide technical improvements to a processing unit (e.g., processor 106) associated with a quantum computing device (e.g., a quantum processor, quantum hardware etc.), a circuit-QED system and/or a superconducting quantum circuit. For example, qubit state assignment system 102 can be weakly coupled (e.g., a weak electrical coupling as defined above with reference to readout device 116 and FIG. 1) to a qubit (e.g., qubit 118) and/or an environment of a qubit, where such weak coupling can facilitate improved accuracy of simulation results (e.g., of simulations performed by qubit state assignment system 102). In this example, such improved accuracy of such simulation results can facilitate improved processing accuracy, improved processing efficiency, and/or improved processing performance of a processing unit associated with qubit state assignment system 102 (e.g., processor 106).

In some embodiments, qubit state assignment system 102 can employ hardware and/or software to solve problems that are highly technical in nature, that are not abstract and that cannot be performed as a set of mental acts by a human. For example, qubit state assignment system 102 can facilitate: analyzing responses of a multi-mode readout device coupled to a qubit; analyzing responses of readout devices coupled to a qubit; and/or assigning a readout state of the qubit based on the responses. In such an example, qubit state assignment system 102 can process microwave frequency signals and/or employ various complex mathematical functions and/or algorithms (e.g., equations (1) and/or (2) described above with reference to FIG. 1) comprising a multitude of variables to facilitate execution of the various operations of qubit state assignment system 102 as described herein.

It is to be appreciated that qubit state assignment system 102 can perform a multi-mode qubit readout and state assignment process utilizing various combinations of electrical components, mechanical components, and circuitry that cannot be replicated in the mind of a human or performed by a human. For example, analyzing responses of a multi-mode readout device coupled to a qubit and/or responses of multiple single-mode readout devices coupled to a qubit using various electrical connections, electrical circuitry, and microwave frequency signals and/or assigning a readout state of the qubit based on the responses, are operations that are greater than the capability of a human mind. For instance, the amount of data processed, the speed of processing such data, and/or the types of data processed by qubit state assignment system 102 over a certain period of time can be greater, faster, and/or different than the amount, speed, and/or data type that can be processed by a human mind over the same period of time.

According to several embodiments, qubit state assignment system 102 can also be fully operational towards performing one or more other functions (e.g., fully powered on, fully executed, etc.) while also performing the above-referenced multi-mode qubit readout and state assignment process. It should be appreciated that such simultaneous multi-operational execution is beyond the capability of a human mind. It should also be appreciated that qubit state assignment system 102 can include information that is impossible to obtain manually by an entity, such as a human user. For example, the type, amount, and/or variety of information included in analysis component 108 and/or assignment component 110 can be more complex than information obtained manually by a human user.

Figure 8:
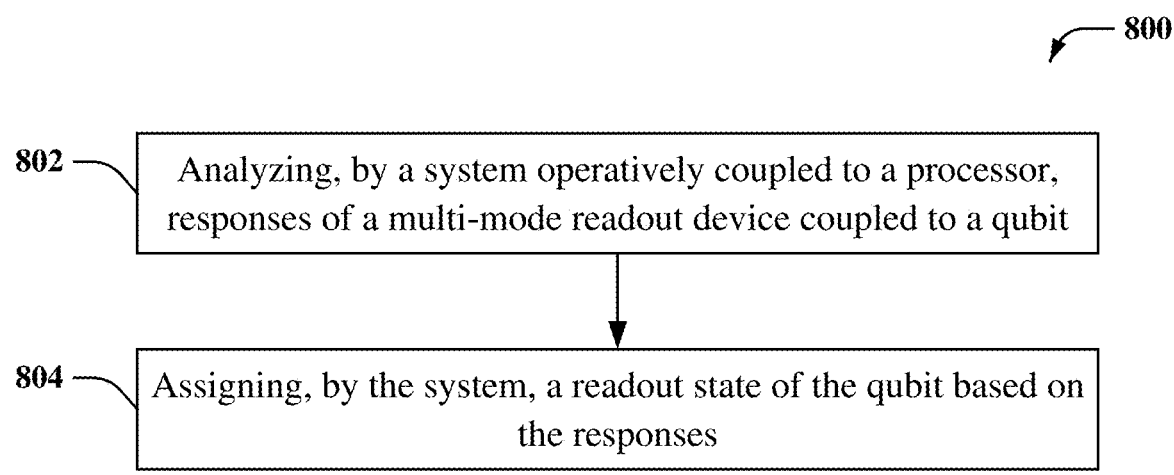
FIG. 8 illustrates a flow diagram of an example, non-limiting computer-implemented method that can facilitate multi-mode qubit readout and state assignment components in accordance with one or more embodiments described herein.

FIG. 8 illustrates a flow diagram of an example, non-limiting computer-implemented method 800 that can facilitate multi-mode qubit readout and state assignment components in accordance with one or more embodiments described herein. Repetitive description of like elements and/or processes employed in respective embodiments is omitted for sake of brevity.

At 802, analyzing, by a system (e.g., via qubit state assignment system 102 and/or analysis component 108) operatively coupled to a processor (e.g., processor 106), responses (e.g., qubit responses, dispersive readouts of a qubit, qubit state information, quantum information, etc.) of a multi-mode readout device (e.g., readout device 116) coupled to a qubit (e.g., qubit 118). At 804, assigning, by the system (e.g., qubit state assignment system 102 and/or assignment component 110), a readout state of the qubit (e.g., a qubit state) based on the responses.

Figure 9:
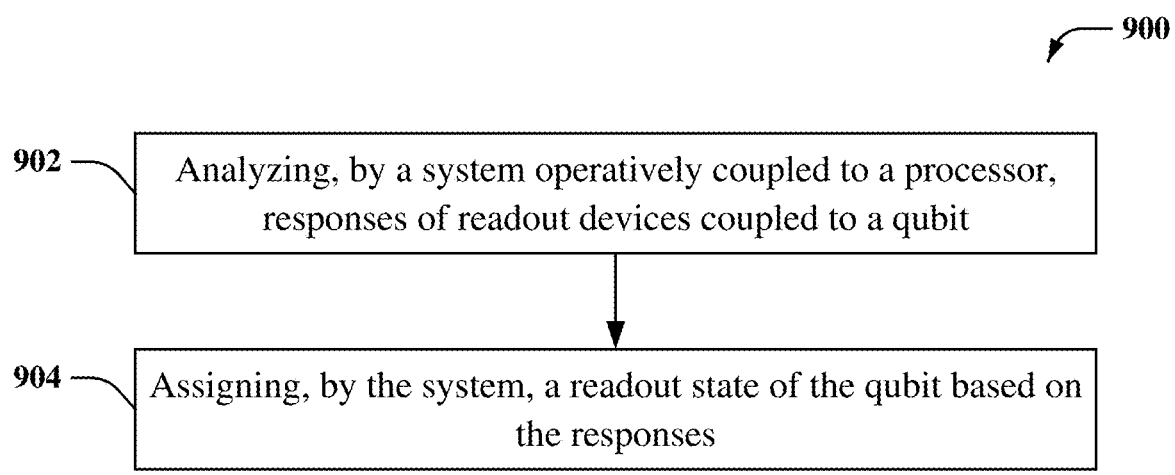
FIG. 9 illustrates a flow diagram of an example, non-limiting computer-implemented method that can facilitate multi-mode qubit readout and state assignment components in accordance with one or more embodiments described herein.

FIG. 9 illustrates a flow diagram of an example, non-limiting computer-implemented method 900 that can facilitate multi-mode qubit readout and state assignment components in accordance with one or more embodiments described herein. Repetitive description of like elements and/or processes employed in respective embodiments is omitted for sake of brevity.

At 902, analyzing, by a system (e.g., via qubit state assignment system 102 and/or analysis component 108) operatively coupled to a processor (e.g., processor 106), responses (e.g., qubit responses, dispersive readouts of a qubit, qubit state information, quantum information, etc.) of readout devices (e.g., readout devices 116a, 116b, 116n) coupled to a qubit (e.g., qubit 118). At 904, assigning, by the system (e.g., qubit state assignment system 102 and/or assignment component 110), a readout state of the qubit (e.g., a qubit state) based on the responses.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
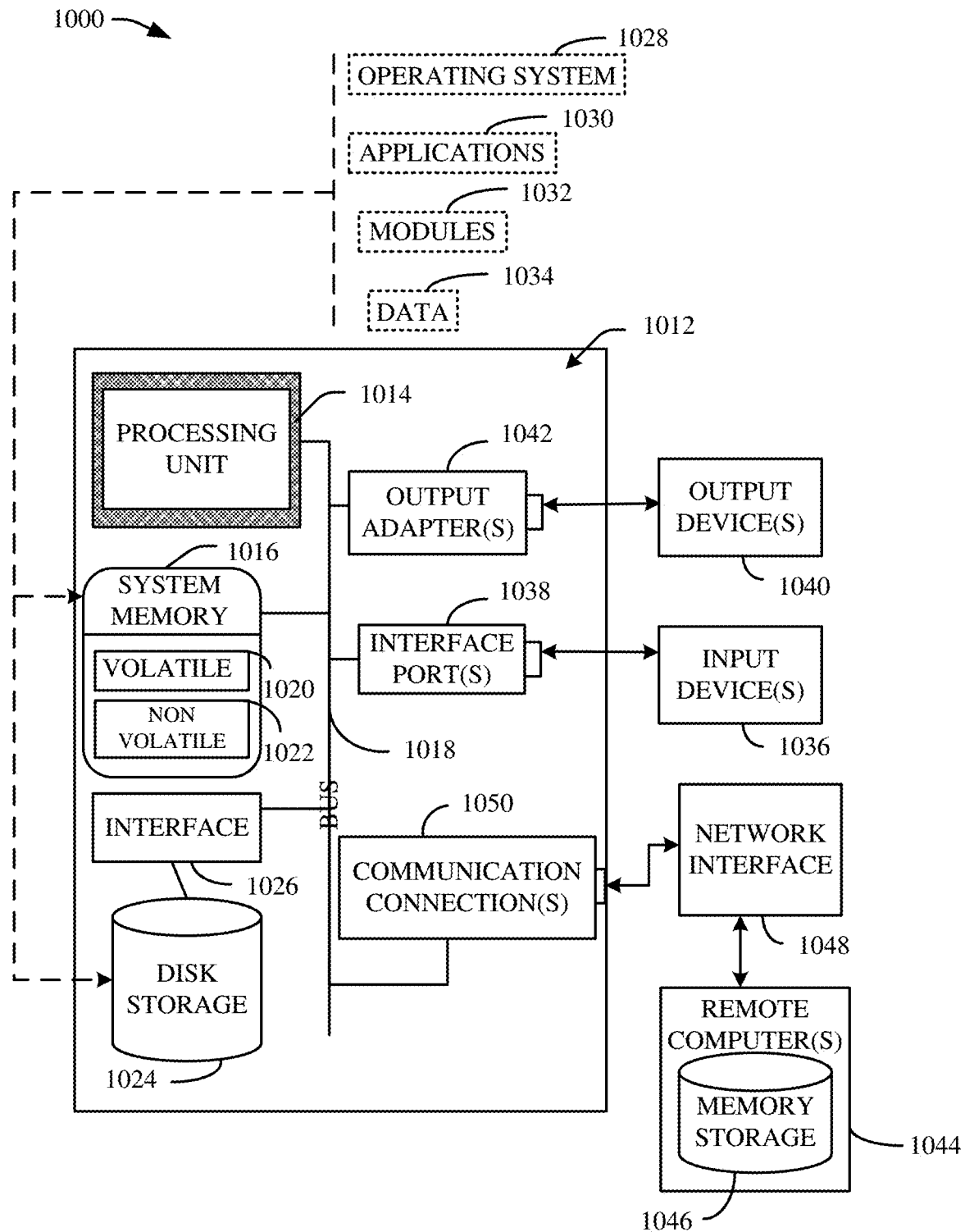
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a processor that executes the computer executable components stored in memory;
   a multi-mode readout device electrically coupled to a qubit based on one or more parameters that can facilitate a defined qubit readout fidelity and a defined qubit decay time protection; and
   an analysis component that analyzes responses of the multi-mode readout device.

2. The system of claim 1, wherein the multi-mode readout device comprises a superconducting resonator having multiple probing taps.

3. The system of claim 1, wherein the analysis component analyzes the responses based on at least one of: a Boolean logic analysis; a kernel-integrated response of the responses; a time trajectory of the responses; a linear discriminant analysis; a quadratic discriminant analysis; or a support vector machine analysis.

4. The system of claim 1, wherein the one or more parameters further facilitate a defined qubit dephasing protection.

5. The system of claim 1, wherein the multi-mode readout device is electrically coupled to at least one of the qubit or an environment of the qubit based on a defined electrical coupling value, thereby facilitating improved processing accuracy associated with the processor.

6. The system of claim 1, further comprising an assignment component that assigns a readout state of the qubit based on the responses.

7. The system of claim 1, wherein the multi-mode readout device generates the responses based on simultaneous multi-tone excitation.

8. A computer-implemented method, comprising:
   analyzing, by a system operatively coupled to a processor, responses of a multi-mode readout device electrically coupled to a qubit based on one or more parameters that can facilitate a defined qubit readout fidelity and a defined qubit decay time protection; and
   assigning, by the system, a readout state of the qubit based on the responses.

9. The computer-implemented method of claim 8, further comprising:
   generating, by the system, the responses based on simultaneous multi-tone excitation.

10. The computer-implemented method of claim 8, wherein the analyzing comprises, analyzing, by the system, the responses based on at least one of: a Boolean logic analysis; a kernel-integrated response of the responses; a time trajectory of the responses; a linear discriminant analysis; a quadratic discriminant analysis; or a support vector machine analysis.

11. The computer-implemented method of claim 8, wherein the assigning comprises, assigning, by the system, the readout state based on a majority vote of the responses.

12. The computer-implemented method of claim 8, wherein the analyzing comprises, analyzing, by the system, the responses of the multi-mode readout device electrically coupled to at least one of the qubit or an environment of the qubit based on a defined electrical coupling value.

13. The computer-implemented method of claim 8, wherein the analyzing comprises, analyzing, by the system, the responses of the multi-mode readout device coupled to the qubit based on one or more parameters that facilitate at least one of: a defined qubit readout fidelity; a defined qubit decay time protection; or a defined qubit dephasing protection.

14. A computer program product facilitating a multi-mode qubit readout and state assignment process, the computer program product comprising a computer readable storage medium having program instructions embodied therewith, the program instructions executable by a processor to cause the processor to:
  analyze, by the processor, responses of a multi-mode readout device electrically coupled to a qubit based on one or more parameters that can facilitate a defined qubit readout fidelity and a defined qubit decay time protection; and
  assign, by the processor, a readout state of the qubit based on the responses.

15. The computer program product of claim 14, wherein the program instructions are further executable by the processor to cause the processor to:
  analyze, by the processor, the responses based on at least one of: a Boolean logic analysis; a kernel-integrated response of the responses; a time trajectory of the responses; a linear discriminant analysis; a quadratic discriminant analysis; or a support vector machine analysis.

16. The computer program product of claim 14, wherein the program instructions are further executable by the processor to cause the processor to:
  assign, by the processor, the readout state based on at least one of: a majority vote of the responses; the defined qubit readout fidelity; the defined qubit decay time protection; or a defined qubit dephasing protection.

17. The computer program product of claim 14, wherein the program instructions are further executable by the processor to cause the processor to:
  analyze, by the processor, the responses of the multi-mode readout device electrically coupled to at least one of the qubit or an environment of the qubit based on a defined electrical coupling value.

18. A system, comprising:
  a processor that executes the computer executable components stored in memory, wherein the computer executable components comprise:
  an analysis component that analyzes responses of readout devices electrically coupled to a qubit based on one or more parameters that can facilitate a defined qubit readout fidelity and a defined qubit decay time protection; and
  an assignment component that assigns a readout state of the qubit based on the responses.

19. The system of claim 18, wherein the analysis component analyzes the responses based on at least one of: a Boolean logic analysis; a kernel-integrated response of the responses; a time trajectory of the responses; a linear discriminant analysis; a quadratic discriminant analysis; or a support vector machine analysis.

20. The system of claim 18, wherein the assignment component assigns the readout state based on at least one of: a majority vote of the responses; the defined qubit readout fidelity; the defined qubit decay time protection; or a defined qubit dephasing protection, thereby facilitating a defined coherence time associated with the qubit.

* * * * *